US009251915B2

(12) United States Patent
Lai et al.

(10) Patent No.: US 9,251,915 B2
(45) Date of Patent: Feb. 2, 2016

(54) SEAMLESS FAIL ANALYSIS WITH MEMORY EFFICIENT STORAGE OF FAIL LISTS

(71) Applicant: Advantest Corporation, Tokyo (JP)

(72) Inventors: Hanh Lai, Sunnyvale, CA (US); Edmundo DeLaPuente, Cupertino, CA (US)

(73) Assignee: ADVANTEST CORPORATION, Tokyo (JP)

( * ) Notice: Subject to any disclaimer, the term of this patent is extended or adjusted under 35 U.S.C. 154(b) by 59 days.

(21) Appl. No.: 14/077,048

(22) Filed: Nov. 11, 2013

(65) Prior Publication Data

US 2015/0135026 A1 May 14, 2015

(51) Int. Cl.
*G11C 29/00* (2006.01)
*G11C 29/08* (2006.01)
*G11C 29/56* (2006.01)
*G11C 29/04* (2006.01)

(52) U.S. Cl.
CPC .......... *G11C 29/08* (2013.01); *G11C 29/56008* (2013.01); *G11C 2029/0405* (2013.01); *G11C 2029/5606* (2013.01)

(58) Field of Classification Search
None
See application file for complete search history.

(56) References Cited

U.S. PATENT DOCUMENTS

| | | | | |
|---|---|---|---|---|
| 5,469,450 A * | 11/1995 | Cho et al. | ........................ | 714/766 |
| 5,881,221 A * | 3/1999 | Hoang et al. | ..................... | 714/42 |
| 8,677,306 B1 * | 3/2014 | Andreev et al. | ............... | 716/136 |
| 2002/0019961 A1 * | 2/2002 | Blodgett | ........................ | 714/718 |
| 2003/0074612 A1 * | 4/2003 | Hou et al. | ..................... | 714/723 |
| 2004/0019838 A1 * | 1/2004 | Marr | ............................ | 714/718 |
| 2006/0156134 A1 * | 7/2006 | Mukherjee et al. | ........... | 714/733 |
| 2007/0067685 A1 * | 3/2007 | Yamada et al. | ............... | 714/718 |
| 2007/0168781 A1 * | 7/2007 | Sutardja et al. | ............... | 714/718 |
| 2007/0288793 A1 * | 12/2007 | Gatzemeier et al. | .............. | 714/6 |
| 2008/0177934 A1 * | 7/2008 | Yu et al. | ......................... | 711/103 |
| 2009/0217093 A1 * | 8/2009 | Co | ................................. | 714/30 |
| 2009/0217102 A1 * | 8/2009 | Co | ................................. | 714/42 |
| 2009/0254785 A1 * | 10/2009 | Grunzke | ........................ | 714/719 |
| 2014/0082453 A1 * | 3/2014 | Sikdar et al. | .................. | 714/763 |

* cited by examiner

*Primary Examiner* — Daniel McMahon (57) ABSTRACT

A method for testing memory devices under test (DUTs) using automated test equipment (ATE) is presented. The method comprises retrieving a portion of raw test data from a memory device under test (DUT). It also comprises comparing the portion of raw test data with expected test data to determine failure information, wherein the failure information comprises information regarding failing bits generated by the memory DUT. Next, the method comprises utilizing paging to transfer data comprising the failure information to a filtering module and filtering out the failure information from transferred data using the filtering module. Further, it comprises updating a fail list using the failure information, wherein the fail list comprises address information for respective failing bits within the memory DUT. Finally, it comprises repeating all the prior steps for the next block of raw test data.

20 Claims, 7 Drawing Sheets

SEAMLESS FAIL ANALYSIS WITH MEMORY EFFICIENT STORAGE OF FAIL LISTS

FIELD OF THE INVENTION

Embodiments of the present invention relate generally to automated device testing and more specifically to a low-cost method for automated testing of memory devices.

BACKGROUND OF THE INVENTION

Automated test equipment (ATE) can be any testing assembly that performs a test on a device, semiconductor wafer or die, etc. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor. Automatic Test Equipment (ATE) is commonly used within the field of electrical chip manufacturing. ATE systems both reduce the amount of time spent on testing devices to ensure that the device functions as designed and serve as a diagnostic tool to determine the presence of faulty components within a given device before it reaches the consumer.

In testing devices or products, e.g. after production, it is crucial to achieve among others a high product quality, an estimation of the device or product performance, a feedback concerning the manufacturing process and finally a high customer contentment. Usually a plurality of tests is performed in order to ensure the correct function of a device or product, commonly referred to as a device under test ("DUT") in testing parlance. The plurality of tests is typically part of a test plan that is loaded into the ATE system by the user. The test plan acts as a blueprint for running the tests on the DUTs. The plurality of tests may be compiled in a test flow wherein the test flow may be separated into different test groups which contain one or more tests for testing the device or product. For example, a semiconductor device may be tested with a test flow comprising contact tests, current-voltage tests, logic tests, speed tests, stress tests and functional tests.

Testing memory type DUTs, e.g., NAND flash packages requires some type of error capture and analysis. Conventional ATE solutions for testing memory type DUTs typically capture an entire bitmap of the memory array for the DUT where the errors can be seen can be observed within a 2-dimensional representation of the memory array in the x-y plane and analyzed. This can be particularly onerous from a resource perspective as memory arrays in current and future memory devices continue to grow. For example, current typical NAND devices can typically store anywhere from 32 Gigabits (Gb) to 128 Gb of information. Further, a typical ATE system can test hundreds of DUTs in parallel. Accordingly, being able to store entire bitmaps for all the DUTs can become exceedingly expensive, both from a memory storage and processing perspective, if not impossible due to tester hardware physical limitations. Not only does storing all the bitmaps require a considerable amount of memory, but also high performance processors are required to rapidly scan all the stored information and find all the fail related information in as short a duration as possible. Further, the larger memory sizes required in typical ATE solutions is an impediment to increase tester parallelism because of the high cost required to build the tester.

Further, another limitation with conventional ATE solution for testing memory type DUTs is that all the failure analyses on the DUTs are conducted during post-processing steps after the entire bitmap arrays have been captured for the respective devices using external error capture memory. It is only after capturing the full bit-maps of the failed memory arrays that the ATE controller of a conventional tester can analyze them to determine how to get rid of bad bits in the memory array and the most efficient way to repair the device if possible. Waiting for all the information to be collected from the DUTs before beginning the redundancy and failure analyses introduces unnecessary latency in the testing process and adds to the cost.

BRIEF SUMMARY OF THE INVENTION

Accordingly, what is needed is an ATE system that provides a lower cost and more efficient solution for capturing errors and performing failure analysis of memory type DUTs.

In one embodiment, the present invention eliminates the larger memories in the ATE systems used to capture bitmaps from multiple DUTs and replaces it with real time compression and analysis hardware. For example, instead of capturing entire bitmap arrays of the DUTs in a single pass, the embodiments of the present invention perform numerous passes in sequence and filter out and compress the critical failure related information from the DUTs in real time before logging it, so that the passing memory bits related information does not need to be saved in error capture memory. By not requiring bitmap memory to implement the tester solution, the embodiments of the present invention result in considerable cost savings.

Further, in one embodiment, embodiments of the present invention also perform the redundancy, failure and repair analyses in real time. Accordingly, embodiments of the present invention advantageously circumvent the latency resulting from capturing the failure related data before conducting failure analyses during post-processing. Embodiments of the present invention perform the analyses in real time by processing multiple blocks of the incoming test data from the DUTs over time and performing numerous passes in sequence using a pipeline configuration. By processing smaller blocks or pages of data in sequence over time, embodiments of the present invention can perform the analyses that a conventional ATE can using much less storage space and fewer computational resources.

By filtering out and compressing failure related information in real time, embodiments of the present invention also advantageously remove the tester hardware requirement of matching the memory DUT minimum size, which is progressively getting larger with advances in technology such that at some point it may not be possible to make the tester solution economically efficient.

Finally, embodiments of the present invention can easily be adapted to future memory DUTs with growing densities and more advanced repair algorithms.

In one embodiment, a method for testing memory devices under test (DUTs) using automated test equipment (ATE) is presented. The method comprises retrieving a portion of raw test data from a memory device under test (DUT). It also comprises comparing the portion of raw test data with expected test data to determine failure information, wherein the failure information comprises information regarding failing bits generated by the memory DUT. Next, the method comprises utilizing paging to transfer data comprising the failure information to a filtering module and filtering out the failure information from transferred data using the filtering module. Further, it comprises updating a fail list using the failure information, wherein the fail list comprises address information for respective failing bits within the memory DUT. Finally, it comprises repeating all the prior steps for the next block of raw test data.

In a different embodiment, a computer-readable storage medium having stored thereon, computer executable instructions that, if executed by a computer system cause the computer system to perform a method for testing memory devices under test (DUTs) using automated test equipment (ATE) is disclosed. The method comprises retrieving a portion of raw test data from a memory device under test (DUT). It also comprises comparing the portion of raw test data with expected test data to determine failure information, wherein the failure information comprises information regarding failing bits generated by the memory DUT. Next, the method comprises utilizing paging to transfer data comprising the failure information to a filtering module and filtering out the failure information from transferred data using the filtering module. Further, it comprises updating a fail list using the failure information, wherein the fail list comprises address information for respective failing bits within the memory DUT. Finally, it comprises repeating all the prior steps for the next block of raw test data.

In another embodiment, a system for testing memory devices under test (DUTs) using automated test equipment (ATE) is disclosed. The system comprises a test site module operable to retrieve a portion of raw test data from a memory device under test (DUT). The test site module, in turn, comprises: (a) comparator circuitry operable to compare the portion of raw test data with expected test data to determine failure information, wherein the failure information comprises information regarding failing bits generated by the memory DUT; (b) a first processor operable to utilize paging to transfer blocks of data sequentially comprising the failure information to a filtering module; and (c) an FPGA module. The FPGA module comprises: (a) a fail filtering module operable to filter out the failure information from transferred data; and (b) a fail list generator module operable to update a fail list using the failure information, wherein the fail list comprises address information for respective failing bits within the memory DUT.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "generating," "retrieving," "comparing," "filtering," and "masking" or the like, refer to actions and processes (e.g., flowchart 700 of FIG. 7) of a computer system or similar electronic computing device or processor (e.g., system 110 of FIG. 1). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Figure 1:
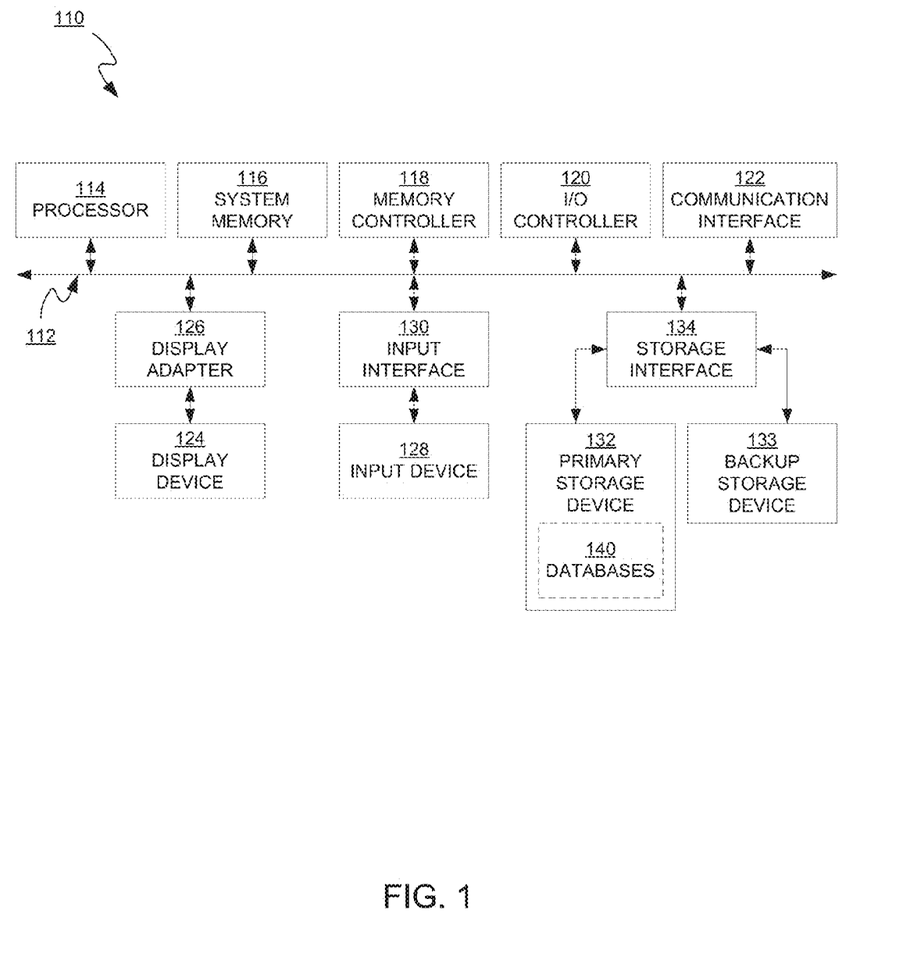
FIG. 1 is a computer system on which embodiments of the automated test system of the present invention used for testing memory devices under test (DUTs) can be implemented in accordance with one embodiment of the present invention.

FIG. 1 is a computer system on which embodiments of the automated test system (ATE) of the present invention used for testing memory devices under test (DUTs) can be implemented in accordance with one embodiment of the present invention. For example, computing system 110, in one embodiment, could implement the site controller of the tester system, wherein the site controller connects to and controls the ATE of the present invention used for testing memory DUTs. Computing system 110 broadly represents any single or multi-processor computing device or system capable of executing computer-readable instructions. Examples of computing system 110 include, without limitation, workstations, laptops, client-side terminals, servers, distributed computing systems, or any other computing system or device. In its most basic configuration, computing system 110 may include at least one processor 114 and a system memory 116.

Processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 1, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 1, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 1, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 1, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 1, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 1 need not be present to practice the embodiments described herein. The devices and subsystems referenced above may also be interconnected in different ways from that shown in FIG. 1. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

For example, a computer program for running test plans may be stored on the computer-readable medium and then stored in system memory 116 and/or various portions of storage devices 132 and 133. When executed by the processor 114, the computer program may cause the processor 114 to perform and/or be a means for performing the functions required for sharing resources between multiple test cores in a concurrent test environment.

Seamless Fail Analysis with Memory Efficient Storage of Fail Lists

In one embodiment, the present invention provides a lower cost and more efficient solution for capturing errors and performing failure analysis of memory type DUTs.

In one embodiment, the present invention eliminates the larger memories in the ATE systems used to capture bitmaps from multiple DUTs and replaces it with real time compression and analysis hardware. For example, instead of capturing entire bitmap arrays of the DUTs in a single pass, embodiments of the present invention perform numerous passes in sequence and filter out and compress the critical failure related information from the DUTs in real time before logging it, so that the redundant pass related information does not need to be saved in error capture memory. By not requiring bitmap memory to implement the tester solution, the embodiments of the present invention result in considerable cost savings.

Further, in one embodiment, the present invention also performs the redundancy, failure and repair analyses in real time. Accordingly, embodiments of the present invention advantageously circumvents the latency resulting from capturing complete failure related data before conducting failure analyses during post-processing. By filtering out and compressing failure related information in real time, embodiments of the present invention also advantageously removes the tester hardware requirement of matching the memory DUT minimum size, which is progressively getting larger with advances in technology such that at some point it may not be possible to make the tester solution economically efficient.

Embodiments of the present invention perform the analyses in real time by processing multiple blocks of the incoming test data from the DUTs over time and performing numerous passes in sequence using a pipeline configuration. By processing smaller blocks or pages of data in sequence over time, embodiments of the present invention can perform the analyses that a conventional ATE can using much less storage space and fewer computational resources.

Finally, the present invention, in one embodiment, can easily be adapted to future memory DUTs with growing densities and more advanced repair algorithms.

Figure 2A:
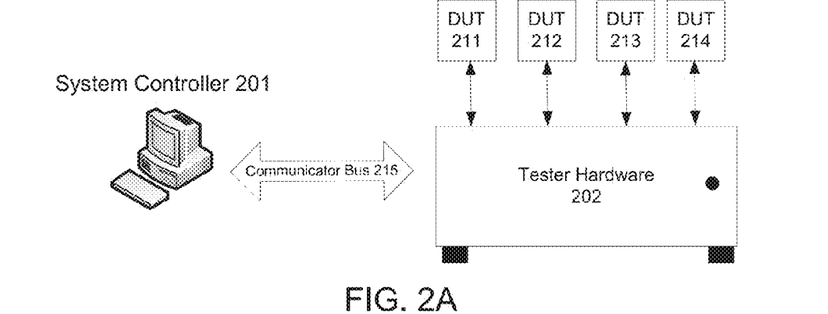
FIG. 2A is a schematic block diagram for an automated test equipment (ATE) apparatus for testing memory DUTs on which embodiments of the present invention can be implemented in accordance with one embodiment of the present invention.

FIG. 2A is a schematic block diagram for an automated test equipment (ATE) apparatus for testing memory DUTs on which embodiments of the present invention can be implemented in accordance with one embodiment of the present invention. In one embodiment, the system controller 201 comprises one or more linked computers. In other embodiments, the system controller often comprises only a single computer. The system controller 201 is the overall system control unit, and runs the software for the ATE that is responsible for accomplishing all the user-level testing tasks, including running the user's main test plan.

The communicator bus 215 provides a high-speed electronic communication channel between the system controller and the tester hardware. The communicator bus can also be referred to as a backplane, a module connection enabler, or system bus. Physically, communicator bus 215 is a fast, high-bandwidth duplex connection bus that can be electrical, optical, etc. In one embodiment, communicator bus 215 can use the TCP/IP protocol. System controller 201 sets up the conditions for testing the DUTs 211-214 by programming the tester hardware through commands sent over the communicator bus 215.

Tester hardware 202 comprises the complex set of electronic and electrical parts and connectors necessary to provide the test stimulus to the devices under test (DUTs) 211-214 and measure the response of the DUTs to the stimulus, and compare it against the expected response. In one embodiment, tester hardware 202 can comprise multiple site controllers, wherein each site controller is connected to multiple DUTs. Each site controller is a computer used in a device test and, in one embodiment, can perform substantially the same function as computing system 110. A test plan program can be executed on a site controller. The site controllers are connected to the system controller and test operations performed by a user are processed on the system controller, which controls the site controllers over communicator bus 215.

Figure 2B:
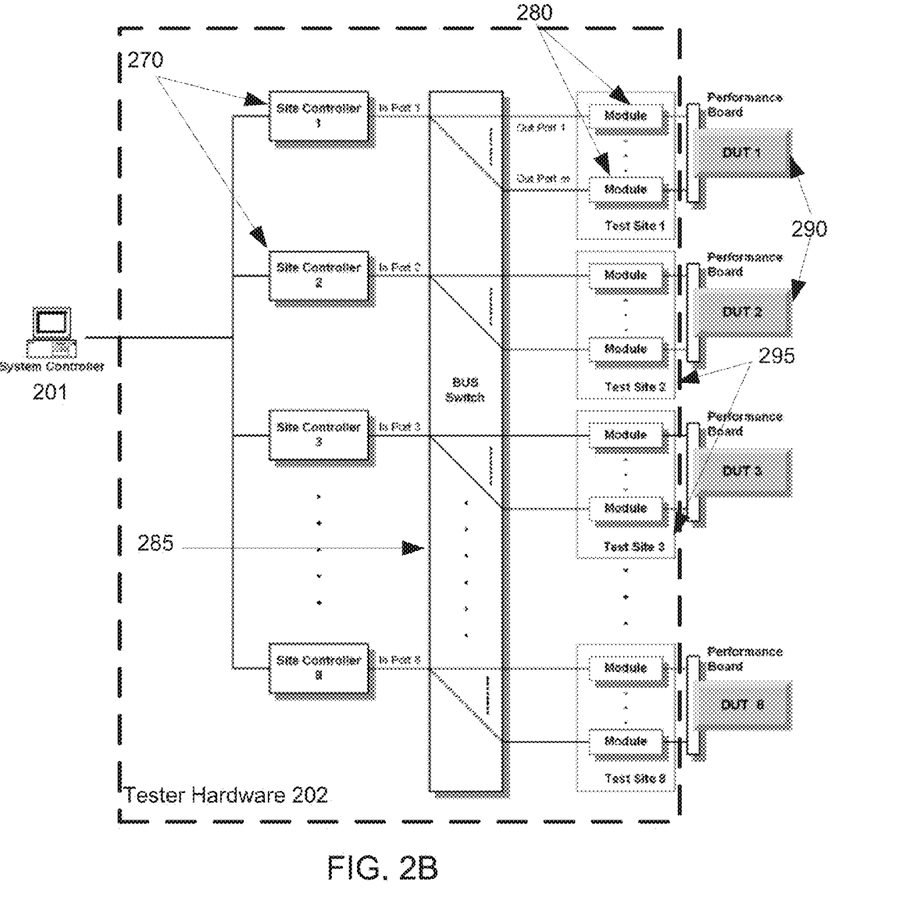
FIG. 2B is a more detailed schematic block diagram of one embodiment of the ATE apparatus of FIG. 2A.

FIG. 2B is a more detailed schematic block diagram of one embodiment of the automated test equipment apparatus of FIG. 2A. In the embodiment illustrated in FIG. 2B, tester hardware 202 can comprise multiple site controllers 270, wherein each site controller is connected to multiple DUTs 290. Each site controller 270 can control a test site 295, which comprises one or more test modules 280. As indicated above, each site controller is a computer used in a device test and, in one embodiment, can perform substantially the same function as computing system 110. A test plan program can be executed on a site controller, which controls test modules 280 in the course of performing device tests for DUTs 290. The site controllers 270 are connected to the system controller, which controls the site controllers over communicator bus 215. In some embodiments, test developers cannot directly operate the site controllers but instead operations performed by the developer are processed on the system controller 201, which controls the site controllers via communicator bus 215.

Site controllers 270 and test modules 280, in one embodiment, can be connected via high-speed optical buses. The bus switch 285 has a matrix structure for connecting the site controllers with the test modules. Using the bus switch 285 allows a site controller to connect with any test modules 280, and allows flexibility in configuring bus connections.

Test modules 280 required for device test are typically mounted in the test system test head. Test module configuration can be adapted to the targeted device. A set of test modules 280 required for device test is called a test site. Each test site 295 is controlled by a site controller. There can be various types of test modules for many applications. Some exemplary types of modules are sync-generator module, sync-matrix module, device power supply module, analog module, RF module and digital module.

Figure 3:
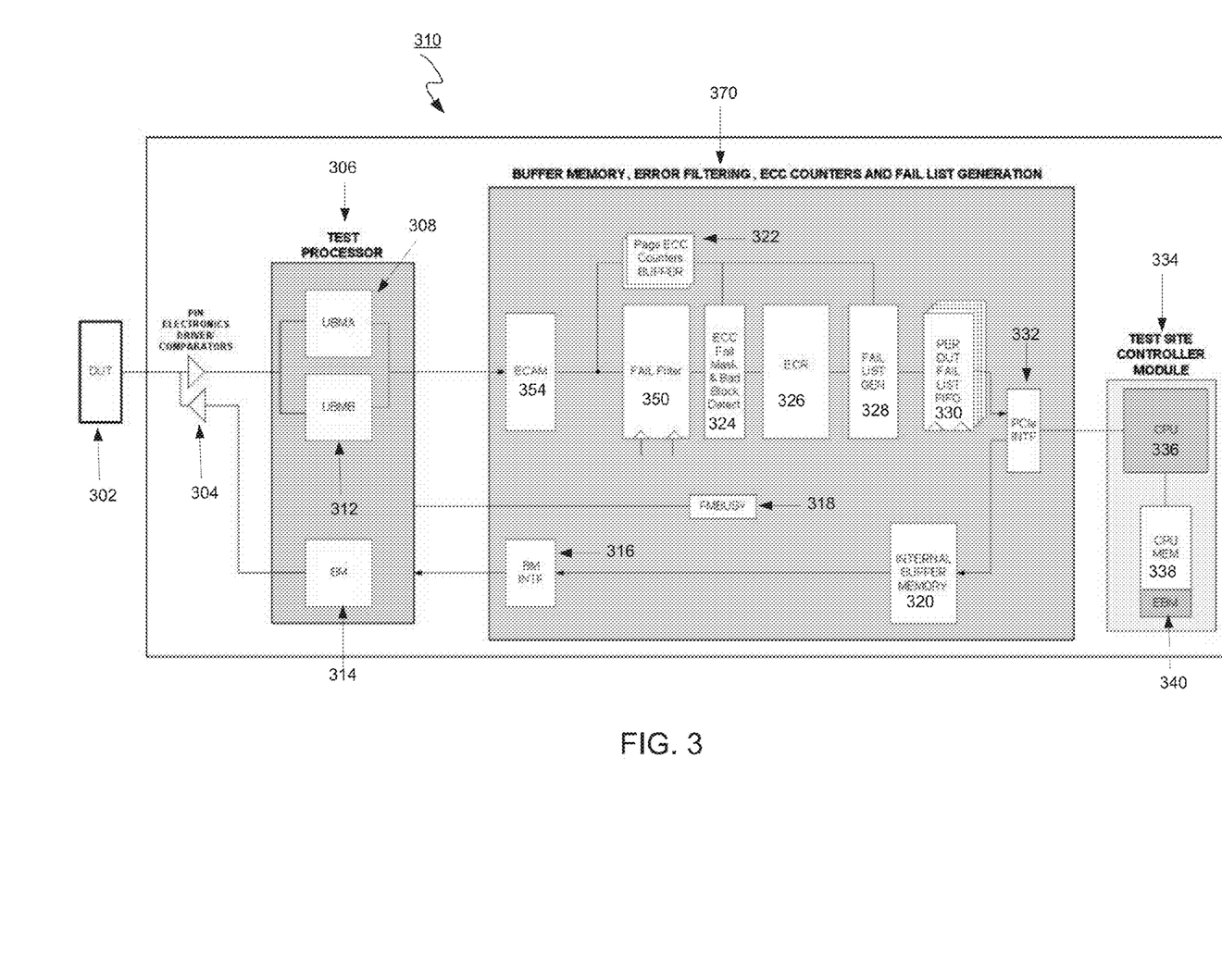
FIG. 3 illustrates a block diagram of the ATE apparatus for performing real time compression and analysis of failure related information from testing memory DUTs in accordance with one embodiment of the present invention.

FIG. 3 illustrates a block diagram of the ATE apparatus for performing real time compression and analysis of failure related information from testing memory DUTs in accordance with one embodiment of the present invention. In one embodiment, the apparatus of the present invention comprises a test site 310, wherein test site 310 can be configured to operate substantially similarly to one of the test sites 295 within tester hardware 202 shown in FIG. 2B. In one embodiment of the present invention, test site 310 comprises a test processor module 306, a bridge FPGA module 370 and a test site controller module 334. Test site 310 can connect to and test one or more DUTs 302 in parallel. In one embodiment, test site 310 can test as many as 8 DUTs in parallel. Test data is received from DUT 302 via pin electronics and comparators 304, it is processed and compressed by test processor 306 and FPGA module 370, and finally the fail information extracted from the test data is conveyed to test site controller module 334.

Test processor module 306 can, in one embodiment, be an application specific integrated circuit (ASIC). In a different embodiment, test processor module 306 can also be an off-the-shelf processor, e.g., an ARM processor programmed to perform the same function. Test processor module 306, in one embodiment, provides the interface between the pin electronics driver and comparators 304 of the test site and the FPGA module 370. Test vectors are run on DUT 302 and comparators 304 are used to discriminate between the high and low threshold values, indicating a 1 or a 0 respectively, read in from the DUT 302. In one embodiment, the vectors are read in from DUT 302 at high speeds, e.g., as high as 1.2 Gigabits per second (Gps). As will be explained below in connection with FIG. 4, test processor module 306 comprises fast memory caches (UBM-A 308 and UBM-B 312) used to capture test data at the maximum speed of the tester.

The test process module 306 conveys the information captured from DUT 302 to the bridge FPGA module 370. Bridge FPGA module 370, as will be discussed further in connection with FIG. 5, in one embodiment, is operable to process and analyze the data from test processor module 306 in real time. For example, the FPGA module 370 can, among other things, mask fail data that can be corrected in software, and also it can compress and synthesize error related information that cannot be corrected in software into convenient fail lists for each connected DUT so that only the precise location of the failures can be reported out instead of all the redundant pass related information that is reported by conventional tester devices.

Finally, the test site controller module 334, as will be discussed further in connection with FIG. 6, in one embodiment, gathers the fail lists communicated by the FPGA module 370 and analyzes the information to provide a corrective solution. In one embodiment, the test site controller module 334 can be part of the site controller 270 as shown in FIG. 2B, while in another embodiment, the test site controller module 334 can be configured within test site 295 itself. In one embodiment, test site controller module 334 can be an off-the-shelf processor, e.g., an ARM processor programmed to perform the necessary functions within test site 310. Further, in one embodiment, test site controller module 334 can be a daughter board into which circuit boards comprising test processor 306 and FPGA module 370 plug in.

Figure 4:
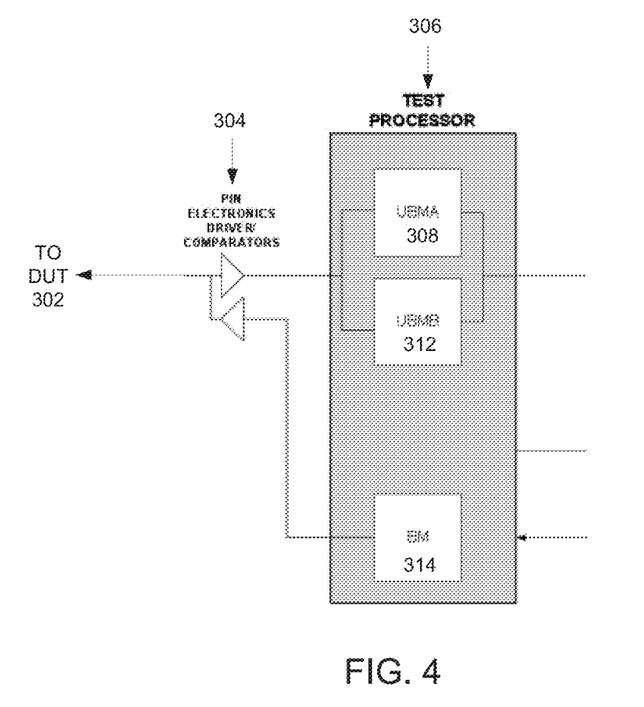
FIG. 4 illustrates a block diagram for the test processor of the ATE apparatus from FIG. 3 in accordance with one embodiment of the present invention.

FIG. 4 illustrates a block diagram for the test processor of the ATE apparatus from FIG. 3 in accordance with one embodiment of the present invention. As discussed above, test processor 306 comprises two banks of memory, Universal Buffer Memory (UBM) A 308 and UBM B 312 to capture test data from the DUT 302 at the maximum speed of the tester. The memory for these two memory banks is size limited so paging is used to off-load the data to FPGA module 370. Paging refers to a scheme of storing and retrieving data from a device in same-sized blocks called pages. In other words, memories UBM-A 308 and UBM-B 312 are temporary storage caches that are limited in size, e.g., their storage capacity may be limited to only a single page or block of test data from DUT 302, wherein the entire DUT may comprise thousands of pages of test data. UBM-A 308 and UBM-B 312 will alternate (or "ping-pong") between each other to store the high-speed information incoming from DUT 302. Accordingly, test processor 306 will grab only a block or page of information at a time from DUT 302 and store that information in one of the two memory banks. It will then grab another page of information and store it in the other memory bank while the first memory bank transmits its information to the FPGA module 370. In this way, the system captures memory in chunks and processes the chunks in sequence.

As stated above, embodiments of the present invention perform the retrieving and analyses of test data in real time by processing multiple blocks of the incoming test data from the DUTs over time and performing numerous passes in sequence using a pipeline configuration.

While UBM-A 308 is receiving and storing a block of incoming data from DUT 302, UBM-B 312 offloads its data to the FPGA module 370 for processing and filtering in a pipelined fashion. Similarly, while UBM-B 308 is receiving and storing a block of incoming data from DUT 302, UBM-A 312 offloads its data to the FPGA module 370 for processing and filtering. In this way, the two memory banks ping-pong between each other to retrieve data from the DUT 302 and transmit it to the FPGA module 370. In one embodiment, the memory banks within the test processor transfer data to the FPGA module 370 at a slower rate than the data is transferred from the DUT 302 to the test processor. For example, data from the test processor 306 to the FPGA can be transferred over at 300 Mbps, which is slower in comparison to the 1.2 Gbps rate at which data is transferred from the DUT 302 to the test processor.

Buffer memory (BM) block 314 can be used, in one embodiment, to store data expected to be read out from the DUT 302. If, for example, the test site apparatus 310 writes random memory data into the memory DUT 302, the expected data that is compared against the data read out from DUT 302 can be stored in BM block 314. Of course, if a fixed pattern e.g., all 0s or all 1s is written into DUT 302, then BM block 314 may not be required.

Figure 5:
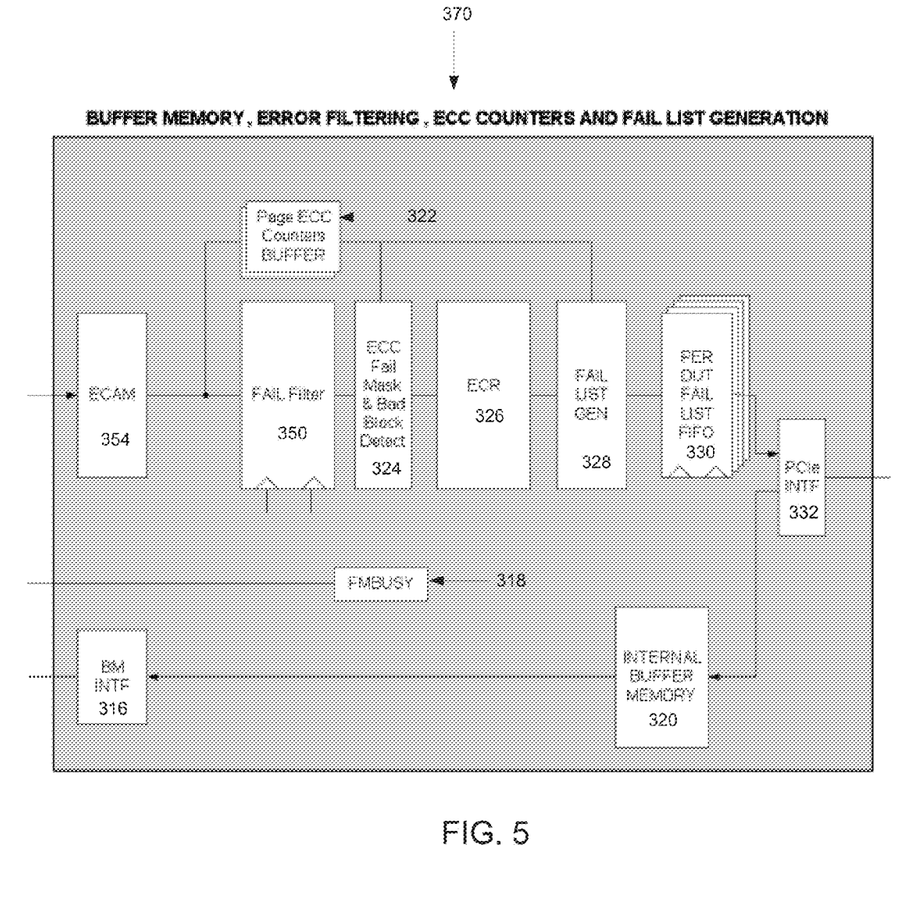
FIG. 5 illustrates a block diagram for the bridge field programmable gate array (FPGA) of the ATE apparatus from FIG. 3 in accordance with one embodiment of the present invention.

FIG. 5 illustrates a block diagram for the bridge field programmable gate array (FPGA) of the ATE apparatus from FIG. 3 in accordance with one embodiment of the present invention. As discussed above, in one embodiment, FPGA module 370 is operable to process and analyze the data from test processor module 306 in real time. The FPGA module 370, in one embodiment, can comprise an ECAM module 354. ECAM module 354 can be a configuration memory and, in the embodiment shown in FIG. 5, is operable to perform substantially the same function as a multiplexer. Depending on the device topology, ECAM module 354 can rearrange the incoming bits from test processor module 306. For example, the data width supported by the UBM memory banks in test processor module 306, may be wider than the width of the data incoming from the DUT 302. For example if DUT 302 comprises 4 DUTs each with a data width of 8 bits, for a total of 32 channels of data, and the UBM data width is 48 bits, then ECAM module 354 can be used to select and filter out the requisite 32 channels of data from the 48 available lanes of data. In other words, the ECAM module 354, in one embodiment, disambiguates the DUTs the data come from and filters out the unused channels.

The ECAM module 354 routes the selected data to Fail Filter module 350. Fail Filter module 350 processes the incoming data and also latches information regarding all the incoming failing bits. Fail Filter module 350 can also comprise circuitry to identify the DUT and address information for the captured failing bits. In one embodiment, if the number of failing bits exceeds a predetermined ceiling such that the device is rendered useless, the Fail Filter module 350 can be configured to signal the test site controller module 334 that the device should be discarded.

In one embodiment of the present invention, FPGA module 370 can be configured with real time error correction check (ECC) capability. In accordance with this capability, FPGA 350 illustrated in FIG. 5 comprises an ECC Fail Mask & Bad Block Detect (EFMBBD) module and a Page ECC Counters Buffer (PECB) module. The PECB module can comprise counters that count the number of incoming error bits. If the number of incoming error bits is below a certain threshold value (the ECC threshold) for a particular DUT, for example, the errors will likely be correctable in software. Accordingly, these errors do not need to be flagged for inclusion in the fail list generated by Fail List Generation module 328 or for subsequent reparation processes in the test site controller module 334 because these errors will be corrected in software. The EFMBBD module can, therefore, be used to mask or filter out such failing bits and they are not included in the fail list generated by the FPGA module 370.

In one embodiment, the FPGA module 370 does not comprise the PECB and EFMBBD modules and all the failing bits are reported out as part of the fail lists reported out to test site controller module 334. Accordingly, the FPGA module 370 is configured to report out all the failing bits as part of the fail list generated by the Fail List Generation module 328 without masking out any software-correctable failing bits.

In a typical memory DUT, certain pages or blocks of data can be corrupted to an extent that it may not be possible to repair them. However, the DUT is not discarded simply because of a few corrupted pages or blocks. In one embodiment of the present invention, the EFMBBD module is able to detect and filter these bad blocks out so that no further resources are expended in analyzing or repairing them. By filtering out these bad blocks at an early stage in the FPGA module pipeline, considerable resources are conserved that would otherwise be spent on analyzing blocks that are too far corrupted to be salvaged.

If the number of failures counted by PECB module 322 are above the ECC threshold, then the number of failing bits exceeding the ECC threshold are tagged and transmitted to the subsequent blocks in the pipeline for real time failure analysis, while the remaining failing bits that are correctable in software are masked out by the EFMBBD module 324. In other words, not masking out the failing bits exceeding the ECC threshold effectively tags them for subsequent analysis and repair by the later blocks in the pipeline.

The failure information that is not masked out is then transmitted over to the ECR memory module 326. The ECR module 326, in one embodiment, is a temporary buffer in which incoming fail data is stored. Saving all the incoming failure related information in the ECR module 326 allows the pipeline to catch up and synchronize before the fail list is generated by Fail List Generation 328 module. The ECR module 326 comprises all the clean failure related information that can be generated into a fail list by Fail List Generation module 328. This information is used by the Fail List Generation module 328 to generate a fail list that, among other things, has information regarding the identification of the DUT that failed and the address of the failing bits. The fail list generated by the Fail List Generation module 328, in one embodiment, is augmented on a per page basis. In other words, module 328 augments fail lists in real time with information for every new page or block it receives sequentially from the pipeline. In other words, information for every new page or block is simply added to the prior generated fail list.

By filtering out all the failure related information in real-time by processing and analyzing each chunk of data sequentially, embodiments of the present invention avoid needing to parse through all the test data information at the same time that a conventional ATE would need to parse through in order to identify the failures. This results in significant cost saving because a typical memory DUT will only have a few failing bits and parsing through all the test information to identify the few failing bits results in considerable wastage of computational and storage resources. Further, the present invention allows the post-processor 336 to focus on repairing the failing bits. In effect, the present invention enables a form of data compression that helps manage the internal memory (ECR) size and removes the need for large physical memories outside the FPGA.

The information generated by the Fail List Generation module 328 is separated out on a per DUT basis by the Per DUT Fail List FIFO (PDFLF) module 330. A First In First Out (FIFO) queue is maintained for the failure information received for each DUT within PDFLF module 330. The PDFLF module enables the decoupling of the FPGA module 370 from the CPU 336 within test site controller module 334. The information from the PDFLF module is communicated over to CPU 336 through a PCIe Interface module 332. In different embodiment, other protocols besides PCIe may be used to communicate with CPU 336, e.g., SATA. When the PDFLF module has data available to transfer over to the test site controller module 334, it will flag CPU 336 with an interrupt.

Figure 6:
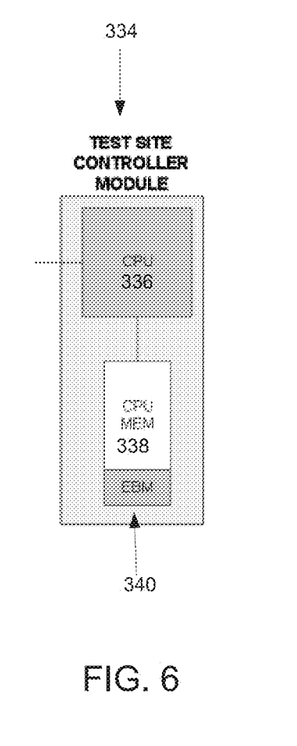
FIG. 6 illustrates a block diagram for the test site controller module of the ATE apparatus from FIG. 3 in accordance with one embodiment of the present invention.

FIG. 6 illustrates a block diagram for the test site controller module of the ATE apparatus from FIG. 3 in accordance with one embodiment of the present invention. Depending on the interrupt service time, the CPU 336 will respond to the interrupt request from the PDFLF module 330 and receive the fail list data and add it to CPU memory 338. In between interrupts from the PDFLF module 330, the CPU 336 is performing real time redundancy analysis and generating repair solutions for previously received failure information.

If for any reason the PDFLF module 330 overflows, it will flag the error to the CPU 336. Further, if the PDFLF module 330 is starting to get full and the CPU 336 has not been able to service an interrupt to retrieve data from module 330, then FMBUSY signal 318 can be used by FPGA module 370 to signal test processor 308 not to send the next page of data. Accordingly FMBUSY signal 318 can be used to perform a handshake between module 306 and module 370 to allow the two blocks to synchronize.

Once the final fail lists are sent and stored in the CPU memory 338, the CPU 336 can perform redundancy analysis and generate repair solutions for the failing bits. In one embodiment, the final fail lists can be stored within CPU memory block 338. The data flow from the test processor 306 to the FPGA module 370 and finally to the test site controller module 334 is intended to be seamless. The pattern can continue to run the analysis hardware is operating on the resultant data basis in the background using information from the fail lists. It is important to note that the size of the fail list databases e.g., CPU memory block 338 and the processing power of the CPU 336 can be upgraded as the sizes of memory DUTs increases to accommodate higher capacities and reduce the analysis times.

The CPU 336, after performing all its analyses, will generate a recommended repair plan informing the user of the locations that need to be repaired in the memory DUT before shipment. As mentioned above, certain errors will be correctable in software as flagged by the ECC blocks 324 and 322, while the other errors will need to be repaired. The recommended repair plan generated by CPU 336 will provide details regarding the repairs that need to be performed on memory DUT 302.

In one embodiment, the EBM memory module 340 can also be used to store data patterns that the user wants to test on the memory DUT 302. As discussed above, the user, for example, may want to write a random pattern into and read out the same pattern from the DUT 302. In such cases, the EBM module can be used to store these patterns. The patterns are communicated by the CPU 336, through PCIe interface module 332, to internal buffer memory 320 in the FPGA module 370. The internal buffer memory 320 transmits the patterns over to Buffer Memory 314 through Buffer Memory Interface module 316. Data is transacted between EBM 340 and Buffer Memory 314 on a per page basis. The expected data is loaded into Buffer Memory 314 on a per page basis where it is used to compare against data received in either of the memory banks, UBM A 308 or UBM B 312, before it is swapped out with the next page of data. In one embodiment, Buffer Memory 314 can comprise two different memory banks, similar to UBM A 308 and UBM B 312, and operates similarly to UBM A and UBM B, wherein the expected data is swapped into one memory bank through BM Interface 316 while the data from the other one is being compared.

As discussed above, one advantage of embodiments of the present invention is that the analysis and reparation is conducted in the FPGA module 370 and test site controller module 334 in real time by allowing each chunk of data to be sequentially processed for faults in a pipeline configuration. Unlike conventional machines where all the test data is first collected in a sizeable buffer before it is analyzed by software, the FPGA module 370 of the present invention analyzes the test data one block at a time and compresses the failure information while the test site controller module 334 performs reparation of the failures in real time. Accordingly, test times are significantly reduced as compared to conventional ATEs.

Figure 7:
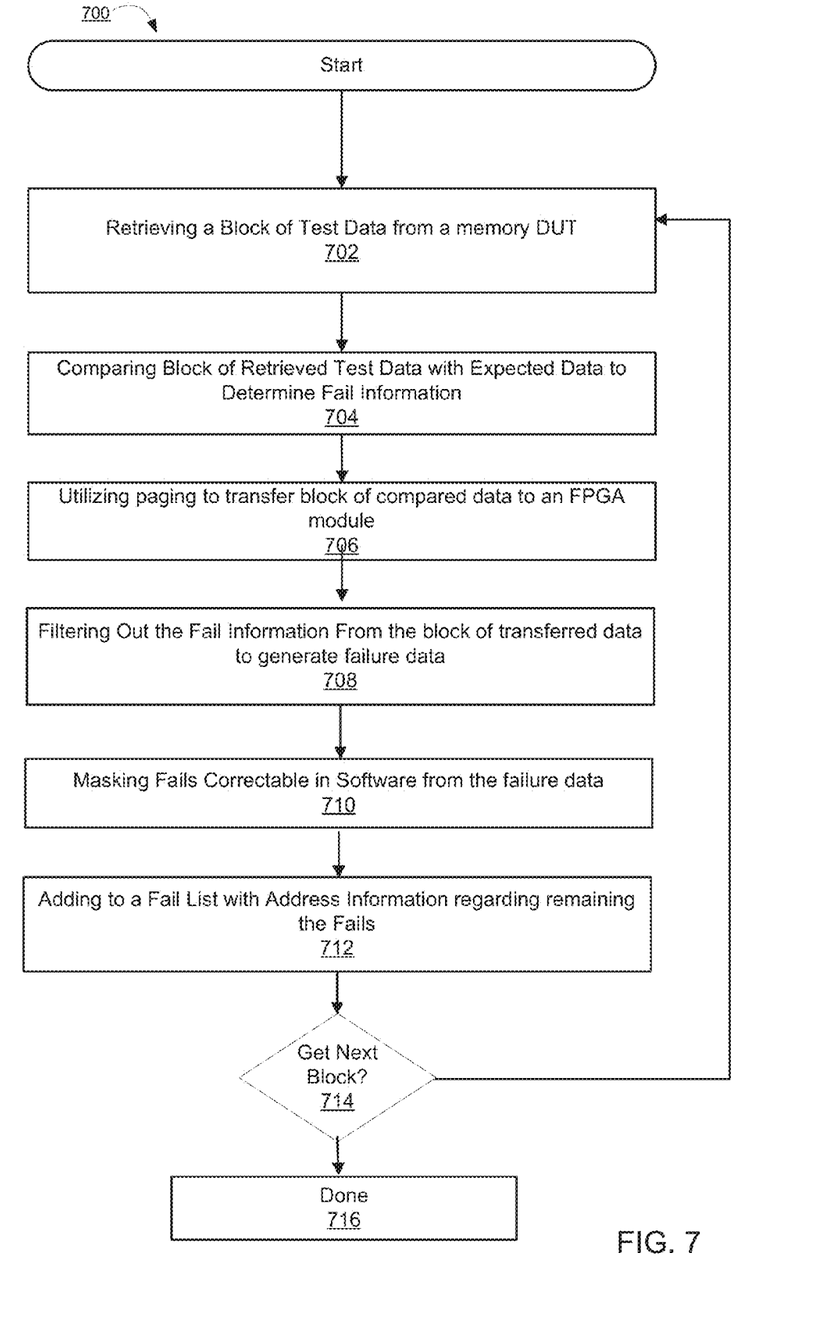
FIG. 7 depicts a flowchart of an exemplary computer controlled process for testing memory devices under test (DUTs) is disclosed in accordance with one embodiment of the present invention.

FIG. 7 depicts a flowchart of an exemplary computer controlled process for testing memory devices under test (DUTs) is disclosed in accordance with one embodiment of the present invention. The invention, however, is not limited to the description provided by flowchart 700. Rather, it will be apparent to persons skilled in the relevant art(s) from the teachings provided herein that other functional flows are within the scope and spirit of the present invention. Flowchart 700 will be described with continued reference to exemplary embodiments described above though the method is not limited to those embodiments.

At step 702, a block of test data is received into test site 310 from memory DUT 302. At step 704, the block is compared using comparators 304 to expected data stored in BM 314 in order to determine points of failure within DUT 302.

At step 706, paging is utilized to transfer the page of compared data to an FPGA module 370. As discussed above, UBM-A 308 and UBM-B 312 memory sizes are limited so paging is used to off-load the data to the FPGA 370, wherein the two memories UBM-A and UBM-B alternate between each other to retrieve blocks of data from comparators 304 and transmit data to FPGA 370. By retrieving and transferring the test data to the FPGA 370 in blocks or pages, embodiments of the present invention enable smaller chunks of data to be processed sequentially in a pipeline configuration and, therefore, require smaller storage memories and lesser computational resources.

At step 708, the page of compared data is filtered out to extract failure data using Fail Filter module 350. At step 710, the combination of PECB module 322 and EFMBBD module 324 is used to mask out fails that are correctable in software.

At step 712, finally, a fail list is updated or added to by Fail List Generation module 328 comprising information about the remaining failures and their addresses, identifying the DUT and locations of the failures. The fail list this information is added to will also comprise information about failure information from prior blocks that have also been processed.

At step 714, a determination is made if there are any further blocks in DUT 302 that need to be processed. If not, the process finishes at step 716. If there are further blocks, then the process is repeated starting at step 702. As discussed above, however, this process is sequential and keeps operating in a pipeline configuration until all the blocks in DUT 302 have been analyzed.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for testing memory devices under test (DUTs) using automated test equipment (ATE), said method comprising:
   a) retrieving a portion of raw test data from a memory device under test (DUT), wherein said ATE is operable to be connected to a plurality of memory DUTs;
   b) comparing said portion of raw test data with expected test data to determine failure information, wherein said failure information comprises information regarding failing bits generated by said memory DUT;
   c) utilizing paging to transfer data comprising said failure information to a filtering module;
   d) filtering out said failure information from transferred data using said filtering module;
   e) updating a fail list using said failure information, wherein said fail list comprises address information for said failing bits within said memory DUT; and
   f) repeating said (a)-(e) for another portion of raw test data.

2. The method of claim 1, further comprising masking out a plurality of failing bits from said failure information prior to said updating, wherein said plurality of failing bits is correctable using software during post-processing, and further wherein information regarding said plurality of failing bits are not included in said fail list.

3. The method of claim 2, further comprising filtering out information pertaining to a plurality of corrupted blocks from said failure information prior to said updating, wherein information regarding said plurality of corrupted blocks is not included in said fail list.

4. The method of claim 1, further comprising:
   generating a repair plan using information from said fail list, wherein said repair plan comprises details regarding repairs that need to be performed on said memory DUT.

5. The method of claim 1, wherein said comparing is performed by comparator circuitry, wherein said comparator circuitry is operable to compare said portion of raw test data from said memory DUT with said expected data stored in a buffer memory to generate said data comprising said failure information.

6. The method of claim 1, wherein said utilizing paging comprises:
   transferring a page of said data comprising said failure information from one of two memory banks to said filtering module, wherein said two memory banks alternate between each other to retrieve the data from said memory DUT and transfer the data to said filtering module.

7. The method of claim 1, further comprising:
   organizing said fail list into a plurality of fail lists, wherein a separate fail list is created for each memory DUT of said plurality of memory DUTs connected to said ATE, and wherein said plurality of fail lists is maintained in a First In First Out (FIFO) order.

8. A non-transitory computer-readable storage medium having stored thereon, computer executable instructions that, if executed by a computer system cause the computer system to perform a method for testing memory devices under test (DUTs) using automated test equipment (ATE), said method comprising:

a) retrieving a portion of raw test data from a memory device under test (DUT), wherein said ATE is operable to be connected to a plurality of memory DUTs;

b) comparing said portion of raw test data with expected test data to determine failure information, wherein said failure information comprises information regarding failing bits generated by said memory DUT;

c) utilizing paging to transfer data comprising said failure information to a filtering module;

d) filtering out said failure information from transferred data using said filtering module;

e) updating a fail list using said failure information, wherein said fail list comprises address information for said failing bits within said memory DUT; and f) repeating said (a)-(e) for another portion of raw test data.

9. The computer-readable medium as described in claim 8, wherein said method further comprises:

masking out a plurality of failing bits from said failure information prior to said updating, wherein said plurality of failing bits is correctable using software during post-processing, and further wherein information regarding said plurality of failing bits are not included in said fail list.

10. The computer-readable medium as described in claim 9, wherein said method further comprises:

filtering out information pertaining to a plurality of corrupted blocks from said failure information prior to said updating, wherein information regarding said plurality of corrupted blocks is not included in said fail list.

11. The computer-readable medium as described in claim 8, wherein said method further comprises:

generating a repair plan using information from said fail list, wherein said repair plan comprises details regarding repairs that need to be performed on said memory DUT.

12. The computer-readable medium as described in claim 8, wherein said comparing is performed by comparator circuitry, wherein said comparator circuitry is operable to compare said portion of raw test data from said memory DUT with said expected data stored in a buffer memory to generate said data comprising said failure information.

13. The computer-readable medium as described in claim 8, wherein said utilizing paging comprises:

transferring a page of said data comprising said failure information from one of two memory banks to said filtering module, wherein said two memory banks alternate between each other to retrieve the data from said memory DUT and transfer the data to said filtering module.

14. The computer-readable medium as described in claim 8, wherein said method further comprises:

organizing said fail list into a plurality of fail lists, wherein a separate fail list is created for each memory DUT of said plurality of DUTs connected to said ATE, and wherein said plurality of fail lists is maintained in a First In First Out (FIFO) order.

15. A system for testing memory devices under test (DUTs) using automated test equipment (ATE), said system comprising:

a test site module operable to retrieve a portion of raw test data from a memory device under test (DUT), wherein said test site module comprises:

comparator circuitry operable to compare said portion of raw test data with expected test data to determine failure information, wherein said failure information comprises information regarding failing bits generated by said memory DUT;

a first processor operable to utilize paging to transfer blocks of data sequentially comprising said failure information to a filtering module; and an FPGA module comprising:

a fail filtering module operable to filter out said failure information from transferred data; and a fail list generator module operable to update a fail list using said failure information, wherein said fail list comprises address information for said failing bits within said memory DUT.

16. The system of claim 15, wherein said test site module further comprises:

an error correction check module operable to mask out a plurality of failing bits from said failure information prior to an update of said fail list, wherein said plurality of failing bits is correctable using software during post-processing, and further wherein information regarding said plurality of failing bits are not included in said fail list.

17. The system of claim 16, wherein said error correction check module is further operable to filter out information pertaining to a plurality of corrupted blocks from said failure information prior to said update of said fail list, wherein information regarding said plurality of corrupted blocks is not included in said fail list.

18. The system of claim 15, wherein said test site module further comprises:

a second processor operable to receive said fail list and further operable to generate a repair plan using information from said fail list, wherein said repair plan comprises details regarding repairs that need to be performed on said memory DUT.

19. The system of claim 15, wherein said comparator circuitry compares said portion of raw test data from said memory DUT with said expected data stored in a buffer memory to generate said data comprising said failure information.

20. The system of claim 15, wherein said first processor comprises two memory banks, and wherein said first processor is operable to transfer a page of said data comprising said failure information from one of said two memory banks to said FPGA module to perform said paging, wherein said two memory banks alternate between each other to retrieve said portion of raw test data from said memory DUT and transfer said page of said data to said filtering module.

* * * * *